United States Patent [19]

Mukai

[11] Patent Number: 4,617,723

[45] Date of Patent: Oct. 21, 1986

[54] METHOD AND DEVICE FOR CREATING AN ACTIVATABLE CONDUCTING LINK IN A SEMICONDUCTOR DEVICE

[75] Inventor: Ryoichi Mukai, Kawasaki, Japan

[73] Assignee: Fujitsu Limited, Kawasaki, Japan

[21] Appl. No.: 566,411

[22] Filed: Dec. 28, 1983

[30] Foreign Application Priority Data

Dec. 28, 1982 [JP] Japan .................. 57-230100

[51] Int. Cl.[4] .................... H01L 21/263; H01L 21/26
[52] U.S. Cl. .................... 29/576 B; 29/571; 29/574; 29/577 C; 148/1.5; 148/187; 427/88
[58] Field of Search .............. 29/576 B, 571, 574, 29/577 C; 148/1.5, 187; 427/88

[56] References Cited

U.S. PATENT DOCUMENTS

| | | | |
|---|---|---|---|
| 3,771,026 | 11/1973 | Asai et al. | 317/234 R |
| 4,286,250 | 8/1981 | Sacchetti | 219/121 L |
| 4,296,372 | 10/1981 | Feuerbaum | 29/574 |
| 4,338,139 | 7/1982 | Shinada | 148/1.5 |
| 4,351,674 | 9/1982 | Yoshida et al. | 29/576 B |
| 4,372,989 | 2/1983 | Menzel | 427/53.1 |
| 4,387,503 | 6/1983 | Aswell et al. | 29/577 C |
| 4,425,700 | 1/1984 | Sasaki | 29/571 |
| 4,436,582 | 3/1984 | Saxena | 148/DIG. 140 |
| 4,462,150 | 7/1984 | Nishimura et al. | 29/576 B |
| 4,476,157 | 10/1984 | Shinozaki | 29/576 B |
| 4,503,315 | 3/1985 | Kamioka et al. | 219/121 LF |
| 4,505,029 | 3/1985 | Owyang et al. | 29/589 |
| 4,545,116 | 10/1985 | Lau | 29/591 |

FOREIGN PATENT DOCUMENTS 0063819  5/1980  Japan ..................... 29/571

OTHER PUBLICATIONS

"WAM1.2: HI-CMOSII 4K Static RAM", O. Minato et al., 1981 IEEE International Solid-State Circuits Conference, pp. 14-15.
Aggarwal, B. K. IBM-TDB, 21 (1979) 3271.
Brodsky IBM-TDB, 17 (1974) 1814.
Chu et al., IBM-TDB, 22 (1980), 5335.
Hodgson et al., IBM-TDB 21 (1979), 4286.

Primary Examiner—Upendra Roy
Attorney, Agent, or Firm—Staas & Halsey

[57] ABSTRACT

A method of creating a conducting link between conducting paths of semiconductor device at a specified portion in an integrated circuit. The link is formed using a polysilicon insulating layer having a metal film formed thereon. To activate the link, it is heated by a laser beam and the polysilicon insulating layer and metal film react to form a conducting layer of metal silicide that links the conducting paths. The activation is accomplished by a chemical reaction which forms the metal-silicide at an activation temperature less than an ion diffusion temperature. The lower activation temperature protects devices close to the heated spot, the surface of the substrate is not damaged by a high temperature and the reliablity of the device is increased.

22 Claims, 9 Drawing Figures

METHOD AND DEVICE FOR CREATING AN ACTIVATABLE CONDUCTING LINK IN A SEMICONDUCTOR DEVICE

BACKGROUND OF THE INVENTION

1. Field of the Invention

This invention relates to a fabrication method for a semiconductor device, more particularly, to creating an activatable conducting link in an integrated circuit (IC), to replace bad circuitry with spare or replacement circuitry previously fabricated in the IC.

As the degree integration of ICs grow, the necessity for redundancy within the chip increases in order to enhance device yield. The benefits and necessity for component redundancy have been recognized and recently become economically justifiable by the manufacturers. Redundancy is implemented by providing an IC, for example, a memory chip (or die) with spare circuitry such as spare rows or spare columns of memory cells and increases chip yield.

The replacement of bad circuitry is accomplished by melting a fuse connecting the bad circuitry and creating conducting links associated with the spare circuits. The present invention is involved in the method of creating the activatable conducting links.

2. Description of the Prior Art

Usually, a non-conductive link is formed between specified points in the circuit and when it is necessary to link the points, spot heating changes the non-conductive link to a conductive link. The method of creating links in this manner is set forth, for example, in 1981 IEEE International Solid State Circuit Conference Report, page 14, by O. Minato et al.

FIG. 1 is a cross sectional view of a prior art activatable link. An insulating layer 2, such as silicon dioxide ($SiO_2$), is fabricated on silicon substrate 1. On the insulating layer 2, polycrystalline silicon (polysilicon) conducting paths 3, which are highly doped with an N-type dopant, such as phosphorous, are formed separated from each other by an non-doped polysilicon insulating gap 4 about 1 $\mu$m wide and having a resistivity of more than $10^9$ $\Omega$cm. The above-described structure is covered with a phospho-silicon glass (PSG) sealing layer 5 to protect and passivate the surface. When an electrical link is required between the separated conducting paths 3, the insulating gap 4 is "activated" by laser irradiation. The irradiated portion of the insulating gap 4 is heated up to around 1400° C., and the dopant contained in the separated conducting paths 3 is diffused into the insulating gap 4, reducing its resistivity down to approximately $10^3$ $\Omega$cm. FIG. 2 illustrates a cross sectional view of a conducting link formed by such a process.

There are some undesirable effects resulting from the heating in the process described above. The heat generated by the laser irradiation is transferred to neighboring areas, and the characteristics of the semiconductor device near the spot are affected due to the re-arrangement of the dopant. The surface of the conducting paths 3 where it is exposed from under the sealing layer 5 is oxidized, and, as a consequence, the reliability of the paths 3 is reduced. Furthermore, the PSG sealing layer 5 trends to be porous and the surface becomes rough, collecting dust and moisture, causing insulating problems. In order to activate the conducting link, the temperature of the laser irradiated portion must be raised up to about 1400° C., which requires relatively high laser power to obtain such a high temperature. As long as the conducting link is created by the diffusion of a dopant into insulating gap, the high temperature heating is unavoidable.

SUMMARY OF THE INVENTION

It is an object of the present invention to provide a method for creating a conducting link in a semiconductor device using a low activation temperature, to avoid damage to semiconductor elements near the heated spot.

Another object of the present invention is to provide a method for creating a conducting link in a semiconductor device without melting a PSG sealing layer.

Still another object of the present invention is to reduce the necessary laser power for activating a conducting link to save on the cost of a laser beam source.

A further object of the present invention is to provide an easily constructed activatable conducting link suitable for connecting replacement circuitry an integrated circuit.

An additional object of the present invention is to provide a method for creating an activatable link in an integrated circuit.

An object of the present invention is to provide an activatable conducting link that can be activated at a temperature below the diffussion temperature of dopant ions in the conducting link.

The foregoing objects are attained by a non-doped, high resistivity polysilicon insulating layer covering a specified portion of the conducting paths to be linked over which is formed a metal layer, such as tungsten, molybdenum, etc. The link is activated by a chemical reaction between the metal layer and the polysilicon insulating layer to forming a conductive layer of metal silicide. The resistivity of the metal silicide is low enough to create a conducting link between the conducting paths. A laser beam is used to heat up the link to activate the chemical reaction at a temperature much lower than the temperature necessary to diffuse a dopant in the conducting paths, where the chemical reaction occurs at around 500°–700° C.

These together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENTS

Figure 1:
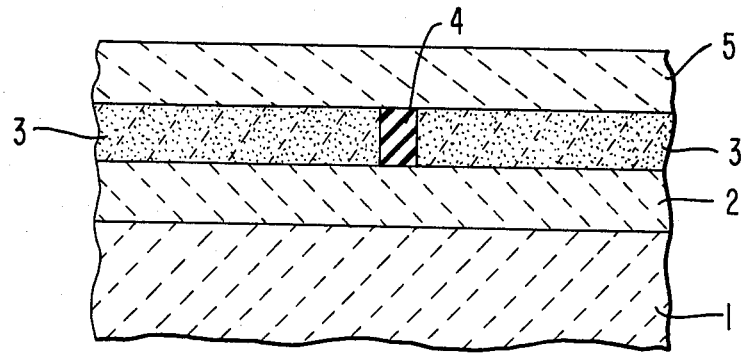
FIG. 1 is an enlarged sectional view of a prior art non-activated conducting link before the application of laser beam in a prior art link formation process.
Figure 2:
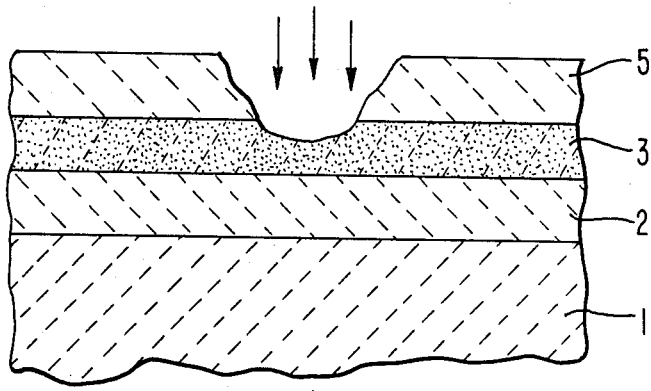
FIG. 2 is an enlarged sectional view of a prior art activated conducting link after the application of laser beam to the device of FIG. 1.

Before describing the method for creating an activated conducting link, the construction of a non-activated conducting link before the application of a laser beam will be described with reference to FIG. 3. At this stage, the link is not conductive or non-activated. An insulating layer 12, such as silicon dioxide (SiO$_2$), covers a semiconductor substrate 11, such as a silicon substrate. Various circuit elements for the IC such as transistors, diodes, resistors, etc. are fabricated or formed during the previous stages of fabrication and these elements are not illustrated in the figures for the sake of simplicity. Conducting paths 13 are formed of a selectively doped polycrystalline silicon (polysilicon) layer about 4000Å in thickness on the insulating layer 12. The resistivity of each path 13 is less than approximately 10$^3$ Ωcm. The conducting paths 13 are insulated from each other by a narrow non-doped polysilicon insulating gap 14 of 1–1.5 μm in width and having a resistivity of more than 10$^9$ Ωcm. Conducting paths 13 and polysilicon insulating gap 14 are covered by another non-doped polysilicon insulating layer 17 about 500Å thick. Next, a thin metal film 16, such as molybdenum, tantalum, tungsten, titanium or platinum of 300–500Å in thickness and 3 μm wide is deposited selectively on a specified portion of the insulating layer 17. The metal film 16 covers polysilicon, the insulating gap 14 and
the conducting paths 13. Thus, a non-activated link is prepared that is isolated from the conducting paths 13 by the polysilicon insulating layer 17. On the surface of the device, a sealing layer 15 is formed to protect the semiconductor surface and is usually made of phospho-silicate glass (PSG).

The process for fabricating a link will be described with reference to FIGS. 4–9. The described process is inserted at the proper stage in the normal process of IC fabrication as would be recognized by those of skill in the art. This normal fabrication process does relate directly to the present invention, therefore, it will not be explained in detail herein. After the circuit elements, such as transistors, diodes, etc. are fabricated, the wiring process between the elements starts and it is in this stage that the additional process, described herein, for fabricating the links is inserted.

Figure 4:
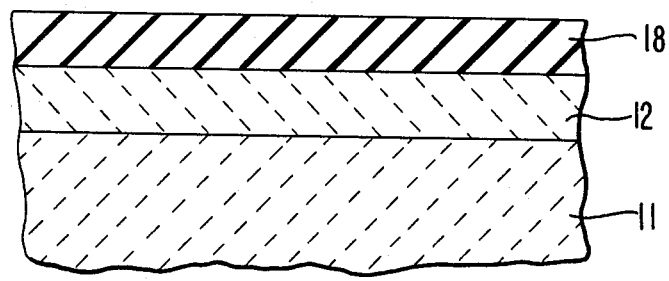
FIGS. 4–9 are enlarged sectional views of a link at each step in a fabricating and activation process according to the present invention.

In FIG. 4, the silicon substrate 11 includes the above-discussed circuit elements which are coated with an insulating layer 12 which is usually a silicon dioxide (SiO$_2$) film. The film can be formed by a conventional IC fabrication process, such as sputtering or chemical vapor deposition (CVD) method, etc. A polysilicon insulating layer 18 is formed on the insulating layer 12 by a conventional CVD method. Normally, the polysilicon insulating layer 18 has a resistivity of more than 10$^9$ Ωcm.

Figure 5:
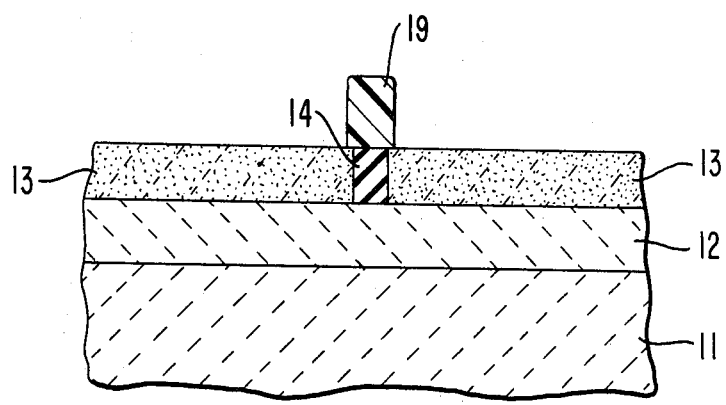

As can be seen in FIG. 5, after the formation of the polysilicon insulating layer 18, a photo-resist pattern 19 is formed on the insulating layer 18 except over the region of the conducting paths, using a conventional photo-lithographic technique. Next, dopants such as arsenic, phosphorous, boron, etc. are conventionally ion-implanted into the portions of the polysilicon insulating layer 18 not covered by the photo-resist pattern 19. Usually, arsenic at a high dose of approximately 10$^{15}$ ions/cm$^2$ are implanted and conducting paths 13 having a resistivity of around 10$^3$ Ωcm are formed. Due to the ion shielding by the photo-resist pattern 19, a polysilicon insulating gap 14 of 1–1.5 μm wide remains between the conducting paths 13.

Figure 6:
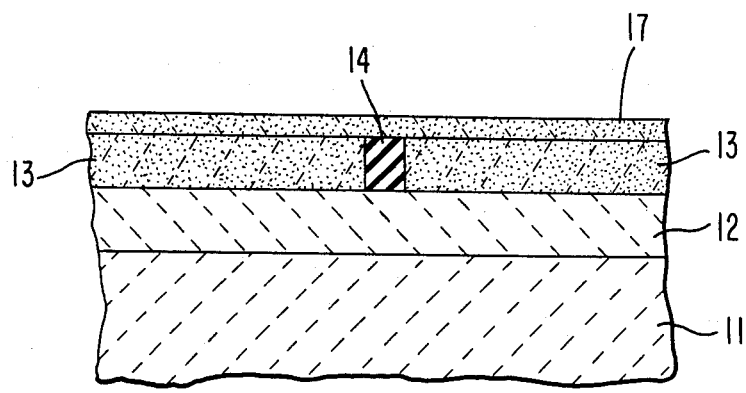

Following the ion-implantation of the dopant, the remaining photo-resist pattern 19 is removed and a non-doped polysilicon insulating layer 17 of about 500 Å in thickness is grown by a CVD method as illustrated in FIG. 6.

Figure 7:
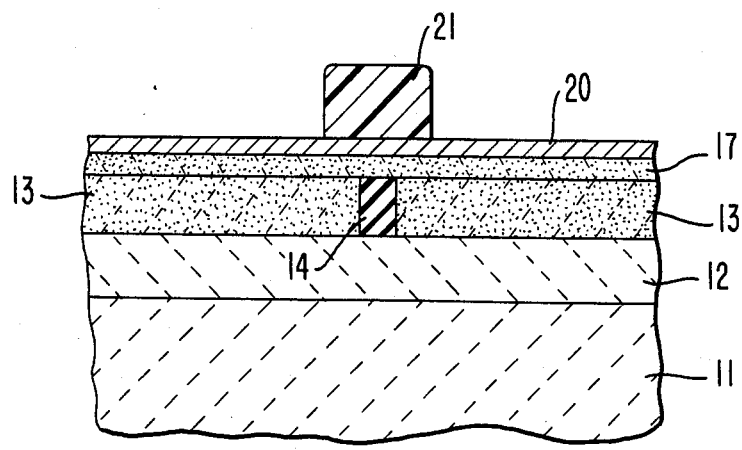

Then, a thin molybdenum metal film 20 of 300–500 Å in thickness is formed over the substrate by sputtering and, as shown in FIG. 7, a photo-resist pattern 21 is formed on the molybdenum film 20 over the portion where the activatable link is to be formed.

Figure 8:
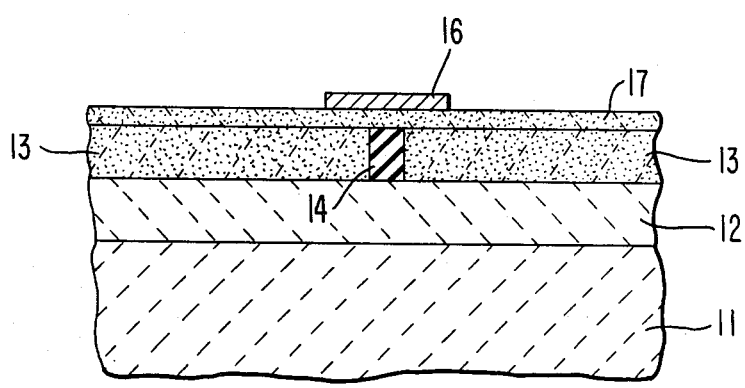

The molybdenum metal film 20 not covered by the photo-resist pattern 21 is etched off by a conventional chemical etching method and a metal layer 16 is formed as illustrated in FIG. 8. The process for fabricating a non-activated conducting link is finished after the above-mentioned etching process and the IC then continues through the ordinary process of IC fabrication.

Figure 9:
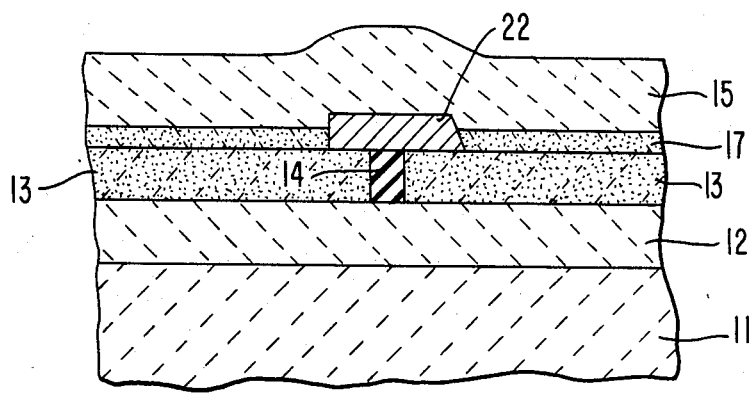

In the final process step, a phospho-silicate glass (PSG) layer 15 is formed by the CVD technique over the surface of the substrate (see FIG. 9).

Figure 3:
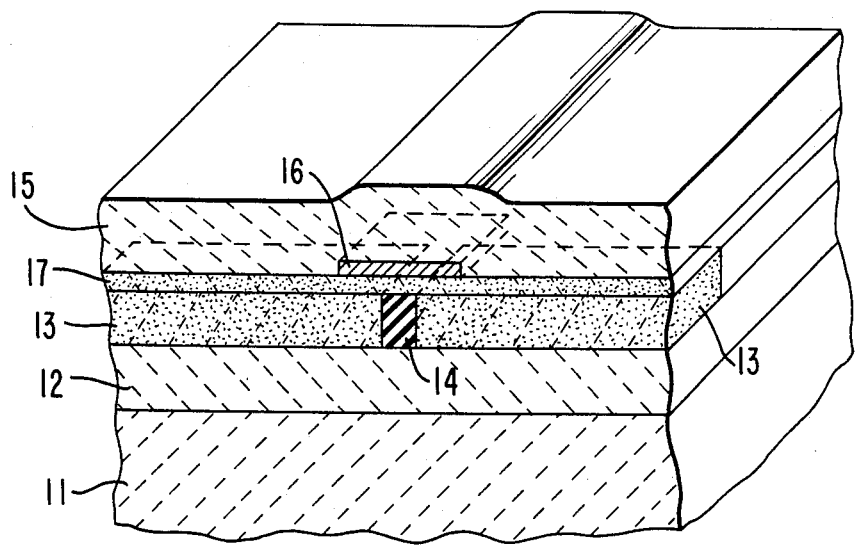
FIG. 3 is an enlarged partial cut away perspective view of a non-activated link, created according to present invention.

The non-activated link comprises a metal layer 16 and a polysilicon insulating layer 17 as illustrated in FIG. 3. This link is not conductive because conducting paths 13 and metal layer 16 are insulated from each other by the polysilicon insulating layer 17. A method of making this link conductive (activated) will now be described.

If a need arises to connect the conducting paths at a specified link, it is necessary to activate the link to make it conductive. To activate the link, it is heated up to a temperature at which the metal layer 16 and polysilicon insulating layer 17 react with each other to form a conductive layer of metal silicide. This activation temperature is much lower than the temperature (1400° C.) which is necessary to activate a link by the prior art diffusion of a dopant from the polysilicon conducting paths into the insulating gap.

Spot heating by laser beam irradiation is suitable because it can be focused to a fine spot and be controlled easily and precisely. The laser beam also penetrates through PSG layer 15 without damaging the layer 15. With a combination of molybdenum and silicon, the link is heated up to 500° C. to create a molybdenum silicide layer 22, that bridges both conducting paths 13 as illustrated in FIG. 9. The resistivity of the silicide layer 22 is 10$^2$ Ωcm which is low enough to provide an electrical short between conducting paths 13, forming a conducting link.

In the above description, a laser beam is used for a heating source, however, a different type beam such as an ion beam or an electron beam, etc. are also appropriate. Furthermore, the material used for the metal film 16 is not limited to molybdenum and can be replaced by tantalum, tungsten, titanium, platinum, etc. Further variations of the aforementioned process will occur to those skilled in the art. For example, a non-doped amorphous silicon layer of high resistivity can be used in place of the polysilicon insulating layer 17 or the conducting paths 13 need not be coplanar.

As can be seen from the above description, however, the advantages and spirit of the present invention reside in utilizing a low temperature chemical reaction to form a metal silicide conductive link. The heating power necessary to activate the link is decreased as compared to prior art links, and there is no danger of damaging circuit elements near the laser heated spot, thereby contributing to an improved reliability in the associated products. Furthermore, the phospho-silicate glass layer 15 does not melt during the laser beam heating, so the surface of the device remains smooth and eliminates problems such as poor electrical insulation.

It will be understood by those of skill in the art that the technique of fabricating conducting links of the present invention can be applied not only to the redundancy circuits in semiconductor memories, but also to the circuits of a programmable read only memory, a master-slice IC, and other semiconductor devices.

The many features and advantages of the present invention are apparent from the detailed specification and thus it is intended by the appended claims to cover all such features and advantages of the device and method which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of creating and activating a conducting link selectively activatable in combination with a plurality of conducting paths in a specified portion of a semiconductor circuit between the conducting paths formed in the same level and electrically insulated from each other, said method comprising the steps of:
   (a) forming a first insulating layer of silicon covering the specified portion between the conducting paths to be linked;
   (b) forming a metal film on the insulating layer over the specificed portion in contact with the insulating layer and creating an activatable conducting link between the conducting paths;
   (c) forming a second insulating layer over the first insulating layer and the metal film; and
   (d) activating the activatable conducting link, when activation is required, by heating the metal film and the corresponding portion of said insulating layer in contact with the metal film, by irradiation through the second insulating layer using an energy beam, to convert the metal film and the portion of the insulating layer in contact with the metal film into a metal silicide layer making the activatable conducting link conductive.

2. A method as recited in claim 1, wherein step (d) comprises heating by a beam selected from among an electron beam, an ion beam and a laser beam.

3. A method as recited in claim 1, wherein the metal film is selected from among molybdenum, tantalum, tungsten, titanium and platinum.

4. A method as recited in claim 1, wherein the insulating layer has a resistivity greater than or equal to $10^9$ $\Omega$cm.

5. A method as recited in claim 1, wherein the silicide has a resistivity less than or equal to $10^2$ $\Omega$cm.

6. A method as recited in claim 1, wherein the insulating layer comprises a non-doped high resistive polysilicon insulating layer.

7. A method as recited in claim 1, wherein the insulating layer comprises a non-doped high resistive amorphous silicon insulating layer.

8. A method as recited in claim 1, wherein said second insulating layer is substantially transparent to said energy beam.

9. A method asrecited in claim 1, wherein said second insulating layer comprises glass.

10. A method of creating a selectively activatable conducting link in a semiconductor device formed on a substrate which activatable link once activated cannot be deactivated, comprising the steps of:
    (a) forming a first insulating layer on the substrate;
    (b) forming a second insulating layer on the first insulating layer;
    (c) forming a resist pattern on a portion of the second insulating layer;
    (d) implanting ions in the second insulating layer except under the resist pattern, and converting the second insulating layer into first and second conducting layers on the same level, and an insulating gap between the first and second conducting layers;
    (e) forming a third insulating layer of silicon covering the first and second conductive layers and the insulating gap;
    (f) forming a metal layer on the third insulating layer, covering the insulating gap and extending over the first and second conductive layers; and
    (g) forming a fourth insulating layer covering the third insulating layer and the metal layer, the activatable conducting link being activated by heating the metal layer and the portion of the third insulating layer under the metal layer through the fourth insulating layer to form a metal silicide contacting the first and second conductive layers.

11. A method as recited in claim 10, wherein said fourth insulating layer comprises a glass sealing layer covering the metal layer and the third insulating layer.

12. A method as recited in claim 10, wherein step (f) comprises the steps of:
    (fi) forming a metal layer covering the third insulating layer;
    (fii) forming a resist pattern on the metal layer over the insulating gap and extending partially over the first and second conductive layers;
    (fiii) etching the metal layer not covered by the resist pattern; and
    (fiv) removing the resist pattern.

13. A method as recited in claim 10, wherein the metal layer and the portions of the third insulating layer are heated to a temperature less than the diffusion temperature for the implanted ions.

14. A method as recited in claim 10, wherein the heating is produced by non-destructive beam irradiation.

15. A method as recited in claim 10, wherein the first insulating layer is silicon dioxide.

16. A method as recited in claim 10, wherein the second insulating layer is polysilicon.

17. A method as recited in claim 10, wherein the third insulating layer is polysilicon.

18. A method as recited in claim 10, wherein the metal layer is selected from among molybdenum tantalum, tungsten, titanium and platinum.

19. A method as recited in claim 10, wherein the first and second conducting layers are coplanar.

20. A method as recited in claim 13, wherein the temperature is approximately 500° C.

21. A method as recited in claim 14, wherein said fourth insulating layer is substantially transparent to the nondestructive beam.

22. A method as reicted in claim 14, wherein the beam is selected from among an electron beam, an ion beam and a laser beam.

* * * * *